(12) United States Patent
Jayasena et al.

(10) Patent No.: US 11,099,788 B2
(45) Date of Patent: Aug. 24, 2021

(54) NEAR-MEMORY DATA REDUCTION

(71) Applicant: Advanced Micro Devices, Inc., Santa Clara, CA (US)

(72) Inventors: Nuwan Jayasena, Santa Clara, CA (US); Shaizeen Aga, Santa Clara, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/658,733

(22) Filed: Oct. 21, 2019

(65) Prior Publication Data

US 2021/0117133 A1  Apr. 22, 2021

(51) Int. Cl.
*G06F 3/06* (2006.01)
*H03M 7/30* (2006.01)

(52) U.S. Cl.
CPC .......... *G06F 3/0661* (2013.01); *G06F 3/0608* (2013.01); *G06F 3/0673* (2013.01); *H03M 7/30* (2013.01)

(58) Field of Classification Search
CPC ..... G06F 3/0608; G06F 3/0661; G06F 3/0673
See application file for complete search history.

(56) References Cited

U.S. PATENT DOCUMENTS

| 2016/0098200 A1* | 4/2016 | Guz | .......................... G06F 7/00 |
| | | | 711/154 |
| 2018/0365438 A1 | 12/2018 | Bhattacharyya et al. | |
| 2019/0311266 A1* | 10/2019 | Liu | ........................ G06N 3/063 |

OTHER PUBLICATIONS

The International Searching Authority, "Search Report" in application No. PCT/US2020/041910, dated Oct. 7, 2020, 15 pages.
Current Claims in application No. PCT/US2020/041910, dated Oct. 2020, 4 pages.

* cited by examiner

*Primary Examiner* — Edward J Dudek, Jr.
(74) *Attorney, Agent, or Firm* — Hickman Becker Bingham Ledesma LLP; Edward A. Becker

(57) ABSTRACT

An approach is provided for implementing near-memory data reduction during store operations to off-chip or off-die memory. A Near-Memory Reduction (NMR) unit provides near-memory data reduction during write operations to a specified address range. The NMR unit is configured with a range of addresses to be reduced and when a store operation specifies an address within the range of addresses, the NRM unit performs data reduction by adding the data value specified by the store operation to an accumulated reduction result. According to an embodiment, the NRM unit maintains a count of the number of updates to the accumulated reduction result that are used to determine when data reduction has been completed.

20 Claims, 7 Drawing Sheets

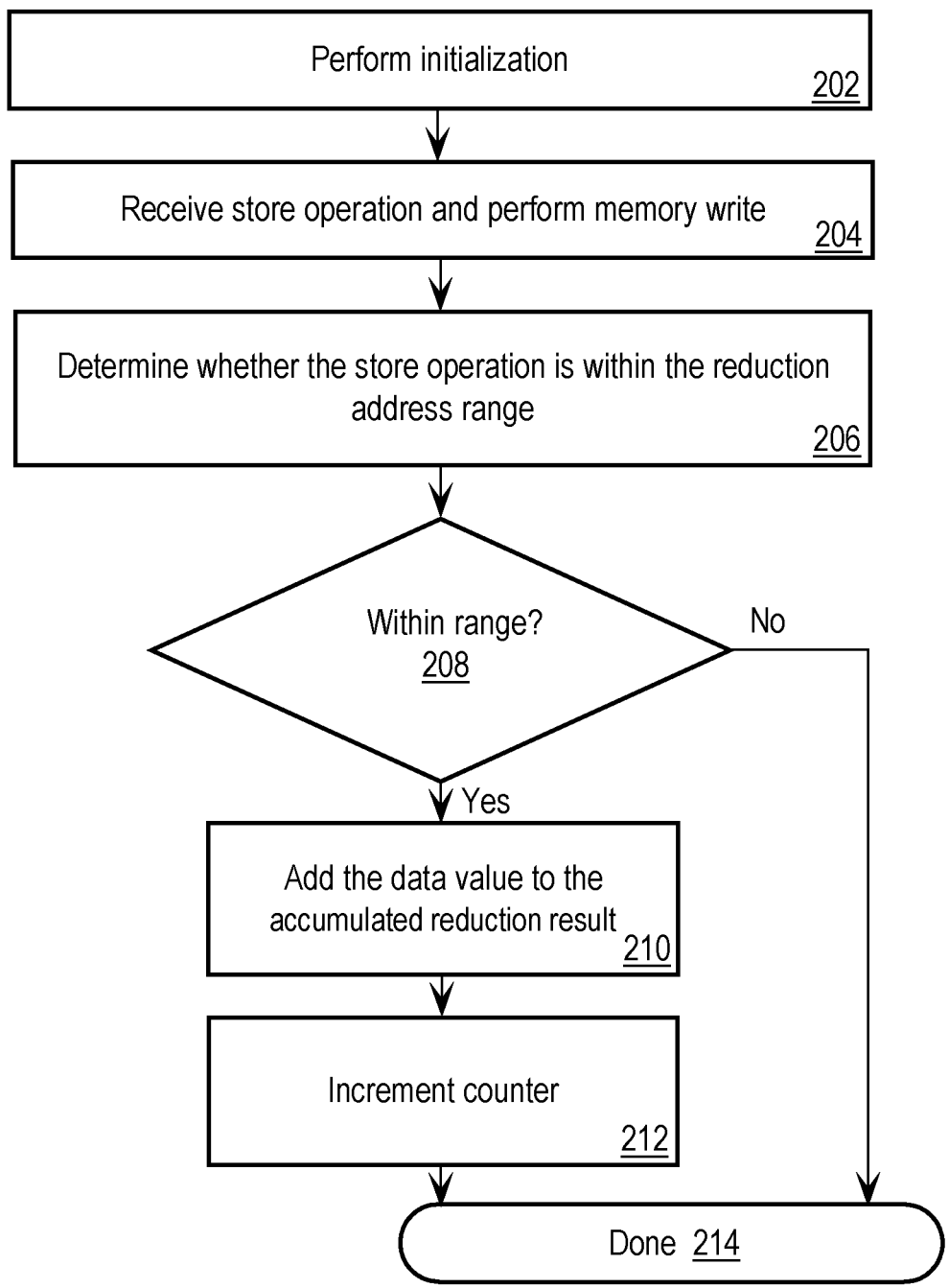

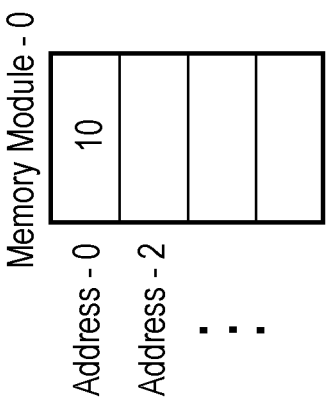
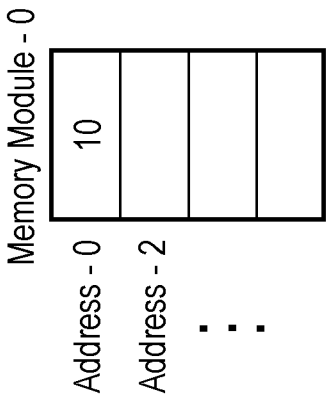
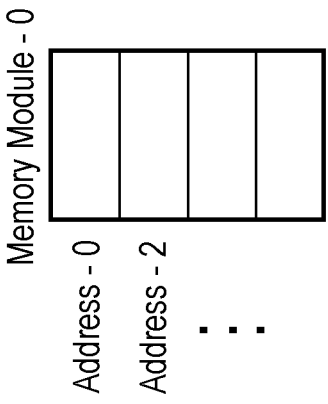
FIG. 3A
FIG. 3B
FIG. 3C
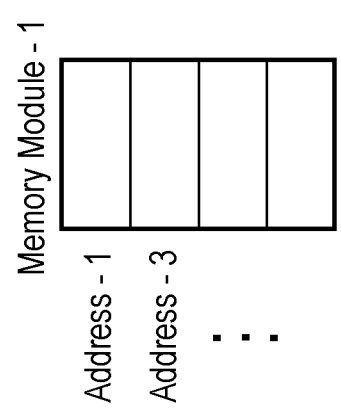
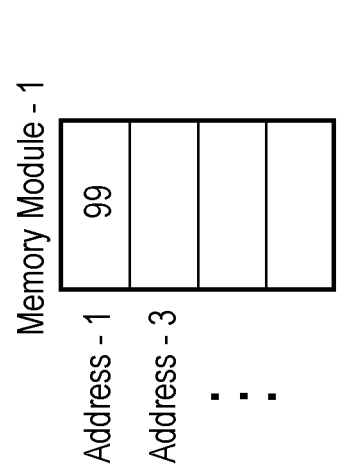

FIG. 3D
(4) Store address (2), value (44)
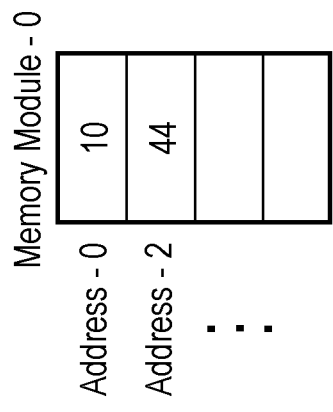
FIG. 3E
(2) Store address (3), value (22)
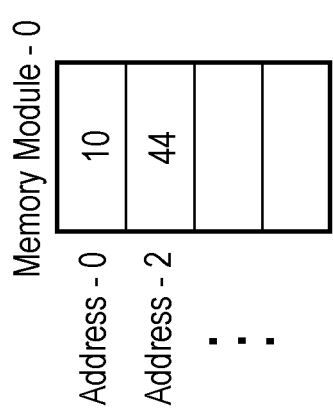
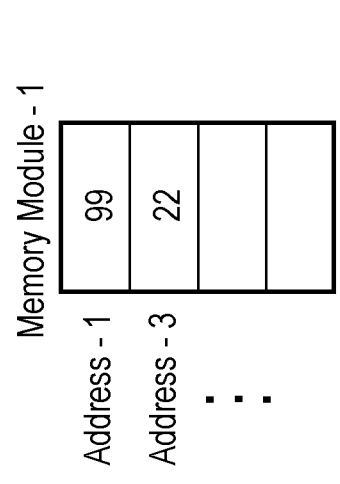
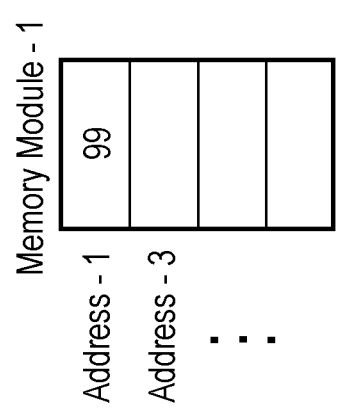

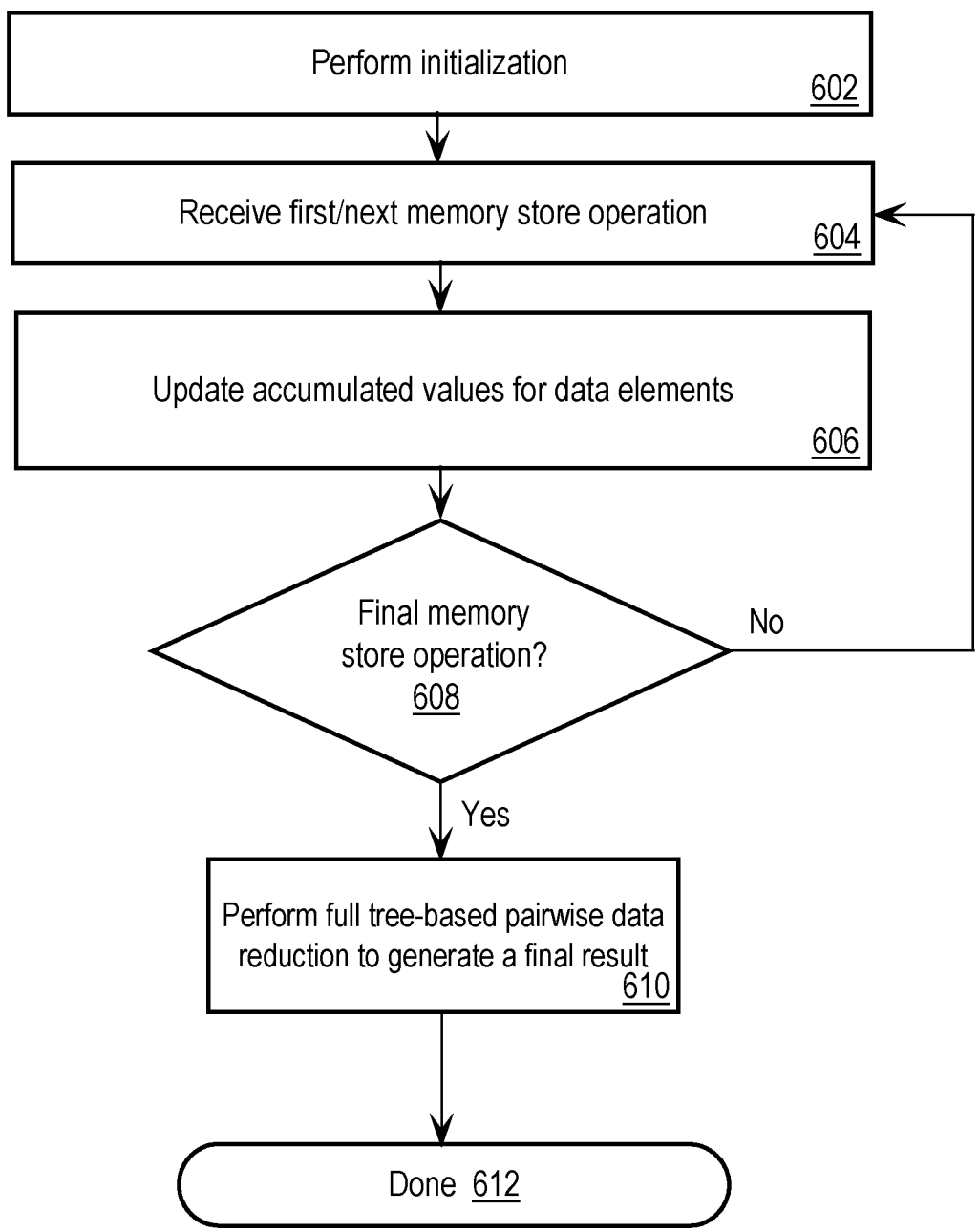

NEAR-MEMORY DATA REDUCTION

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section. Further, it should not be assumed that any of the approaches described in this section are well-understood, routine, or conventional merely by virtue of their inclusion in this section.

Certain types of computing processes, such as machine learning, produce large datasets that must be reduced. Data reduction itself involves add operations that have a low compute-to-byte ratio, meaning that few operations are performed for every byte of data read from memory. But datasets that are larger than the available on-chip or on-die memory, such as caches, must be stored in main memory, and it is expensive to retrieve data from main memory back to on-chip or on-die memory to perform data reduction. The data movement costs are prohibitively high relative to the low computational costs of data reduction, and the data movement can cause cache pollution. The same problems apply to parallel computing methodologies.

One technical solution to the problem involves piggy-backing data reduction operations onto the operations that generate the data to be reduced. While this allows data reduction to be performed as the data to be reduced is generated, there are disadvantages. First, generic computations such as matrix multiplications and convolutions are often implemented to be reusable in a variety of scenarios, and may optimally utilize available on-chip resources, such as CPU/GPU caches, GPU registers, LDS/shared memory, etc., so including data reduction operations can adversely affect performance and further lead to creation and maintenance of even variants thus hindering their reusability. In addition, the operations that generate data sets may employ specific techniques such as multiple writers to the same output location, making it infeasible to include the data reduction operations with any one writer. This is commonly done in GPUs that utilize L2 atomics to merge output from multiple writers to the same memory location. Thus, there is a need for a better approach for reducing large amounts of data generated by computation operations.

BRIEF DESCRIPTION OF THE DRAWINGS

Embodiments are depicted by way of example, and not by way of limitation, in the figures of the accompanying drawings and in which like reference numerals refer to similar elements.

FIG. 2 is a flow diagram that depicts an approach for reducing data using an NMR unit.

FIGS. 3A-3E depict an example implementation of an approach for reducing data in the context of two memory modules.

FIG. 6 is a flow diagram that depicts an approach for performing "in-lane" data reduction.

DETAILED DESCRIPTION

In the following description, for the purposes of explanation, numerous specific details are set forth in order to provide a thorough understanding of the embodiments. It will be apparent, however, to one skilled in the art that the embodiments are be practiced without these specific details. In other instances, well-known structures and devices are shown in block diagram form in order to avoid unnecessarily obscuring the embodiments.

I. Overview
    II. Architecture
    III. Near-Memory Data Reduction
      A. Overview
      B. Changing Shared Resource Allocations for Threads
      C. The Usefulness Metric
      D. Addressing Resource Allocation Oscillation
    IV. Operational Example
    V. In-Lane Data Reduction

I. Overview

An approach is provided for implementing near-memory data reduction during store operations to off-chip or off-die memory. A Near-Memory Reduction (NMR) unit provides near-memory data reduction during write operations to a specified address range. The NMR unit is configured with a range of addresses to be reduced and when a store operation specifies an address within the range of addresses, the NRM unit performs data reduction by adding the data value specified by the store operation to an accumulated reduction result. In an embodiment, the NRM unit maintains a count of the number of updates to the accumulated reduction result that is used to determine when data reduction has been completed.

The approach avoids the costs of reading data from off-chip memory back to on-chip memory to perform data reduction, and also maintains the accumulated reduction result in a register that is easily accessible by a microprocessor, arithmetic units in the logic die of a stacked memory, or memory controllers. In addition, the approach reduces cache pollution and allows data reduction to be performed as data is ready, concurrently with computation operations that produce the data to be reduced.

II. Architecture

Figure 1:
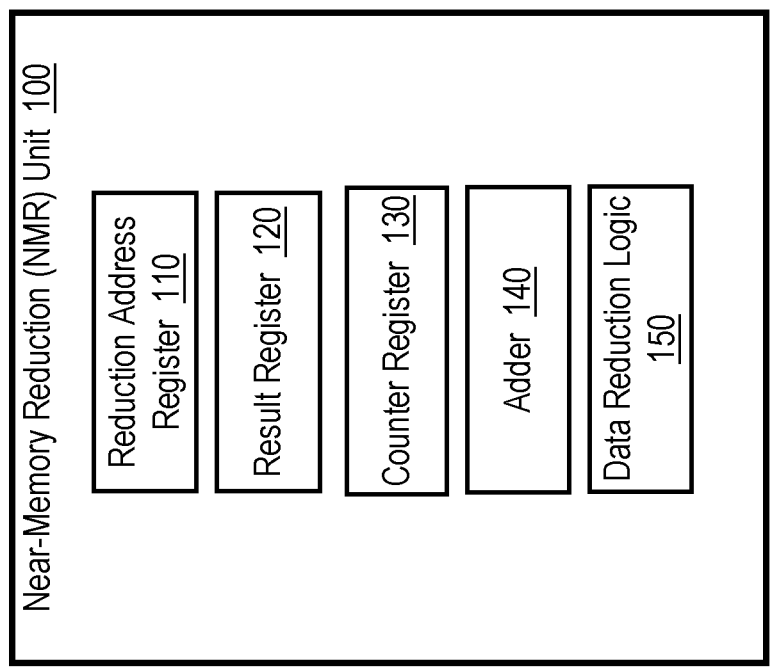
FIG. 1 is a block diagram that depicts a near-memory reduction (NMR) unit for implementing near-memory data reduction as described herein.

FIG. 1 is a block diagram that depicts a near-memory reduction (NMR) unit 100 for implementing near-memory data reduction as described herein. The NMR unit 100 includes a reduction address register 110, a result register 120, an optional counter register 130, an Arithmetic Logical Unit (ALU) 140, and data reduction logic 150. Although embodiments are depicted in the figures and described herein in the context of the NMR unit 100 including an ALU 140, in some embodiments the NMR unit 100 includes digital circuitry for performing any type of data reduction operation, for example, arithmetic and/or logical operations, such as addition, determining a minimum or maximum, AND, OR, XOR, etc. NMR unit 100 includes fewer or additional elements that vary depending upon a particular implementation, and embodiments are not limited to any particular elements. According to an embodiment, the various registers described herein and depicted in the figure as a single register are implemented by multiple registers, depending upon a particular implementation.

The reduction address register 110 stores an address range over which data reduction is performed. As described in more detail hereinafter, the stored address range is a physical or logical address range used by the data reduction logic 150 to determine whether a store operation is to be reduced. The result register 120 stores an accumulated data reduction result. The result register 120 is initialized to a specified value, e.g., zero, in response to an initialization command. Alternatively, the result register 120 is initialized to the specified value in response to the storing of a new address range in the reduction address register 110.

The counter register 130 stores a current count of updates to the result register 120 since the result register 120 was last initialized. The current count of updates is used, for example, by a memory controller to determine when data reduction has been completed. The adder 140, which is implemented as a single adder or multiple adders, adds a data value for a store operation to the accumulated data reduction result stored in the result register 120.

The data reduction logic 150 manages data reduction performed by the NMR unit 100. This includes identifying store operations to be reduced, performing data reduction, and optionally incrementing the current count of updates in the counter register 130. Store operations to be reduced specify an address within the address range maintained in the reduction address register 110. To reduce a store operation, the NMR unit 100 causes the data value specified by the store operation to be added to the accumulated data reduction result stored in the result register 120. The data reduction logic 150 also optionally increments the current count of updates stored in the counter register 130. The data reduction logic 150 is implemented by computer hardware, computer software, or any combination of computer hardware and computer software.

According to an embodiment, a set of primitives, i.e., primitive instructions, or low-level instructions, is provided to allow processes to invoke functionality on the NMR unit 100. Example primitives include, without limitation:

program_reduction_address_range (address_begin, address_end)
read_reduction_result ( )

The program_reduction_address_range (address_begin, address_end) primitive prepares the NMR unit 100 for data reduction by programming the reduction address register 110 with the address range over which data reduction will be performed. According to an embodiment, the address range is identified by a starting address and a length_count, where the ending address is calculated as the address_begin+ length_count. The address range is not limited to contiguous addresses and according to an embodiment, the program_reduction_address_range primitive supports a stride argument that specifies a gap between addresses to be reduced. Alternatively, the program_reduction_address_range primitive supports multiple address range arguments to enable data reduction over multiple non-contiguous, non-strided, address ranges. According to an embodiment, the program_reduction_address_range primitive causes the accumulated data reduction result in the result register 120 and/or the current count in the counter register 130 to be initialized to a specified value, such as zero. The specified value is included as an argument to the program_reduction_address_range primitive or separately configured in the data reduction logic 150. Alternatively, a separate primitive is provided for initializing the result register 120 and/or the counter register 130, such as initialize_nmr (value), where the value argument is the initialization value. The read_reduction_result ( ) primitive causes the accumulated data reduction result to be read from the result register 120.

Although embodiments are depicted in the figures and described herein in the context of the address range and the accumulated data reduction result being stored in registers in the NMR unit 100, embodiments include the address range and the accumulated data reduction result being mapped to memory locations that can be accessed using regular load and store operations.

According to an embodiment, the NMR unit 100 is implemented as a stand-alone entity that is assigned to a corresponding memory module. Alternatively, the various elements and functionality described here with respect to the NMR unit 100 are implemented in a memory controller or in the die of a stacked memory package, such as a Hybrid Memory Cube (HMC) package or a High Bandwidth Memory (HBM) package. According to an embodiment, the NMR unit 100 is implemented close to memory arrays/ banks in the memory layers of 3D stacked memories, or traditional DRAM, or close to, or in, memory controllers or last level caches. Any number of NMR units 100 are implemented to allow concurrent near-memory reduction. The NMR unit 100 is used with any type of memory that can accommodate near-memory computing including, for example, Non-Volatile Dual In-line Memory Modules (NVDIMMs) and NVDIMM-P, SRAM scratchpad memories, etc.

III. Near-Memory Data Reduction

FIG. 2 is a flow diagram 200 that depicts an approach for reducing data using the NRM unit 100. In this example, data reduction is performed using addition operations, but embodiments are not limited to this example and embodiments include using other types of data reduction operations. In step 202, initialization is performed and includes several different tasks that vary depending upon a particular implementation. According to an embodiment, the NMR unit 100, and more specifically the result register 120 and/or the counter register 130, are initialized to a specified value, such as zero. Other implementations use values besides zero. According to an embodiment, initialization of the NMR unit 100 is invoked by an initialization primitive or the program_reduction_address_range primitive, which also specifies the address range to be reduced, as previously described herein. The address range to be reduced is the entire address range supported by a memory module or alternatively, a subset of the address range supported by a memory module. According to an embodiment, initialization includes initializing additional control information, such as the bit widths and data types, e.g., signed/unsigned integer, single/double-precision floating point, etc., of the data to be reduced. This allows the NMR unit 100 to correctly interpret information in received store operations.

After initialization has been completed, then in step 204, a store operation is received that specifies at least an address and a value, and a memory write to the address is performed. The store operation specifies other information, depending upon a particular implementation. According to an embodiment, the memory write is issued in a manner that bypasses or flows-through caches to the memory where near-memory reduction is performed. For example, in an embodiment, the store operation includes an argument or be specifically designed to bypass cache. In other embodiments, the values to be written to memory are captured in caches, along with additional metadata indicating which parts of the cache lines were written, but the values to be reduced are flushed from caches to off-die memory to ensure that the NMR units 100 include the data values in the data reduction. The metadata is tracked and communicated to reduction engines that indicate which subset(s) of cache lines were modified and must be incorporated into the data reduction. This information is available in the form of byte-enable bits in architectures that support partial writes, e.g., certain Graphics Processing Units (GPUs) without Error Correcting Code (ECC). The store operation is received by the NMR unit 100, for example, from a memory controller. Thus, the approach described herein is applicable to store operations that use a cache and store operations that bypass cache and store data directly to off-die memory.

In step 206, a determination is made whether the store operation is within the reduction address range. According to an embodiment, the address specified by the store operation is compared to the address range stored in the reduction address register 110. For example, an address that is specified by the store operation that is greater than or equal to the lower address in the reduction address register 110 and less than or equal to the higher address in the reduction address register 110 is within the reduction address range.

If, in step 208, a determination is made that the store operation is within the reduction address range, then in step 210, the data value specified by the store operation is added to the accumulated reduction result. For example, the data reduction logic 150 causes the data value specified in the store operation to be added, via the adder 140, to the accumulated data reduction result stored in the result register 120. Alternatively, the data value specified in the store operation is processed by a function or scaled, e.g., by a constant, to generate a processed data value that is added to the accumulated data reduction result in the result register 120.

The current count stored in the counter register 130 is optionally incremented. For example, the current count in the form of an integer value is incremented by one each time that data reduction is performed, i.e., when the store operation specifies an address that is within the reduction address range. According to an embodiment, the current count in the counter register 130 is used to stop data reduction, e.g., after a specified number of iterations. For example, algorithms use the current count to provide an approximate data reduction by limiting data reduction to a specified number of iterations over a specified address range to reduce the consumption of computational resources.

The process is complete in step 214 after step 212, or in response to determining, in step 208, that the store operation is not within the reduction address range.

The aforementioned process is repeated any number of times until data reduction has been completed. The completion of data reduction is be determined in different ways that vary depending upon a particular implementation. For example, the data reduction logic 150 performs data reduction for a specified number of iterations. As another example, the program_reduction_address_range primitive includes an argument that specifies the number of data reduction iterations to be performed. This allows an application program to specify a particular number of data reductions to be performed. As a further example, a memory controller or a processing unit reads the current count stored in the counter register 130 of memory modules of interest and stops data reduction when a specified number of data reductions have been completed. For example, the memory controller retrieves the current count from the counter register 130 of multiple NRMs 100 and then notifies a microprocessor that data reduction is complete when all of the current counts satisfy a specified number. The microprocessor then reads the accumulated reduction result from the result register 120 of each NMR unit 100 and reduces these values to a final reduction result. Alternatively, the final reduction result is generated by arithmetic units in the logic die of a stacked memory or close to the memory controller.

Instead of reading the current count stored in the counter register 130, the memory controller, knowing the address range to be reduced, itself tracks the number of store operations to determine when data reduction has been completed. According to an embodiment, the completion of data reduction triggers tree reduction as described in more detail hereinafter. In implementations where data to be reduced is cached, completion of near-memory reduction includes triggering the flushing of cached data to off-chip memory to ensure that the data in cache is included in the data reduction result.

Situations may occur in which an NMR unit 100 receives a store operation that specifies an address that already contains a value from a prior store operation before a data reduction cycle is considered complete. According to an embodiment, an NMR unit 100 detects multiple writes to the same address and flags errors, e.g., sets an error bit, that can be polled by a memory controller and provided to a microprocessor. Alternatively, the new value is added to the accumulated data reduction result stored in the result register 120, which is sufficient for computations that are error-resilient or that are based on approximate algorithms.

IV. Operational Example

FIGS. 3A-3E depict an example implementation of the approach for reducing data in the context of two memory modules, identified in the figures as Memory Module—0 and Memory Module—1. FIGS. 3A-3E depict a chronological sequence of steps. In this example, the two memory modules have interleaved addresses, i.e., addresses 0 and 2 for the first memory module and addresses 1 and 3 for the second memory module, which is commonly done to provide memory module level parallelism. Each of the memory modules has any number of other addresses, depending upon a particular implementation. Each of the two memory modules has a corresponding NMR unit 100.

Starting in FIG. 3A, the two memory modules are initialized, which includes setting the reduced value for each memory module to zero and specifying an address range to be reduced, which in this example are addresses 0-3. As previously described herein, the program_reduction_address_range primitive is used to specify an address range to be reduced and also initialize the result register 120 and counter register 130. Alternatively, a separate initialization command is used to initialize the result register 120 and the counter register 130. The address range to be reduced is stored in the reduction address register 110.

In FIG. 3B, a first store operation is received that specifies a value of 10 is to be stored at address 0. The memory controller that manages the first memory module causes the value of 10 to be stored in address location 0 of Memory Module—0. The data reduction logic 150 of the NMR unit 100 for the first memory module determines whether the address specified in the store operation is within the reduction address range stored in the reduction address register 110. Since the address of 0 specified in the store operation is within the reduction address range stored in the reduction address register 110, the data reduction logic 150 causes the value of 10 specified in the store operation to be added, via the adder 140, to the accumulated reduction result stored in the result register 120. In FIG. 3B, this is depicted by the Reduced Value—0, which is the reduced value for the first memory module, i.e., Memory Module—0, being updated to 10. The data reduction logic 150 of the NMR unit 100 for the first memory module also increments the current count stored in the counter register 130. There is no change for the second memory module, Memory Module—1, since the second memory module does not handle address 0.

Had the address specified by the store operation been outside the reduction address range stored in the reduction address register 110, the value specified by the store operation would be stored in the first memory module, but the value would not be added to the accumulated reduction result stored in the result register 120. For example, suppose that the store operation specified that a value of 7 was to be stored at address 50. Assuming that the first memory module was configured with address 50, the value of 7 would be stored at address 50, but would not be added to the accumulated reduction result stored in the result register 120 because the address of 50 specified in the store operation is not within the reduction address range specified in the reduction address register 110.

In FIG. 3C, a second store operation is received that specifies a value of 99 is to be stored at address 1. The memory controller that manages the second memory module causes the value of 99 to be stored in address location 1. The data reduction logic 150 of the NMR unit 100 for the second memory module determines whether the address specified in the store operation is within the reduction address range stored in the reduction address register 110. Since the address of 1 specified in the store operation is within the reduction address range of 0-3 stored in the reduction address register 110, the data reduction logic 150 causes the value of 99 specified in the store operation to be added, via the adder 140, to the accumulated reduction result stored in the result register 120. In FIG. 3C, this is depicted by the Reduced Value—1, which is the reduced value for the second memory module, i.e., Memory Module—1, being updated to 99. The data reduction logic 150 of the NMR unit 100 for the second memory module also increments the current count stored in the counter register 130. There is no change for the first memory module, Memory Module—0, since the first memory module does not handle address 1.

Continuing with the example, in FIG. 3D a third store operation is received that specifies a value of 44 is to be stored at address 2. The memory controller that manages the first memory module causes the value of 44 to be stored in address location 2. The data reduction logic 150 of the NMR unit 100 for the first memory module determines whether the address specified in the store operation is within the reduction address range stored in the reduction address register 110. Since the address of 2 specified in the store operation is within the reduction address range of 0-3 stored in the reduction address register 110, the data reduction logic 150 causes the value of 44 specified in the store operation to be added, via the adder 140, to the accumulated reduction result stored in the result register 120. In FIG. 3D, this is depicted by the Reduced Value—0 being updated to 54, which is the sum of the prior value of 10 plus the new value of 44. The data reduction logic 150 of the NMR unit 100 for the first memory module also increments the current count stored in the counter register 130. There is no change for the second memory module, Memory Module—1, since the second memory module does not handle address 2.

In the final operation depicted in FIG. 3E, a fourth store operation is received that specifies a value of 22 is to be stored at address 3. The memory controller that manages the second memory module causes the value of 22 to be stored in address location 3. The data reduction logic 150 of the NMR unit 100 for the second memory module determines whether the address specified in the store operation is within the reduction address range stored in the reduction address register 110. Since the address of 3 specified in the store operation is within the reduction address range of 0-3 stored in the reduction address register 110, the data reduction logic 150 causes the value of 22 specified in the store operation to be added, via the adder 140, to the accumulated reduction result stored in the result register 120. In FIG. 3E, this is depicted by the Reduced Value—1 being updated to 121, which is the sum of the prior value of 99 plus the new value of 22. The data reduction logic 150 of the NMR unit 100 for the second memory module also increments the current count stored in the counter register 130. There is no change for the first memory module, Memory Module—0, since the first memory module does not handle address 3.

The technical solution provided by these examples differs from in-memory atomics by 1) providing memory reduction across a range of memory addresses instead of a single memory location; and 2) while in-memory atomics perform a read-modify-write operation to a memory location (with no memory bandwidth reduction), the solution stores accumulated reduction results in the result register 120 of each NMR unit 100, which avoids the need to read data from main memory back into on-chip memory, such as cache, to perform data reduction.

V. In-Lane Data Reduction

It is not uncommon for the width of a memory interface to exceed the width of data elements being stored. For example, the logical width of memory interfaces may be 256 bits or 512 bits, while data elements being stored may be 8 bits, 16 bits, 32 bits, or 64 bits wide. Thus, for a memory module with a 256-bit wide interface, eight 32-bit data elements are stored with each memory store operation.

Figure 4:
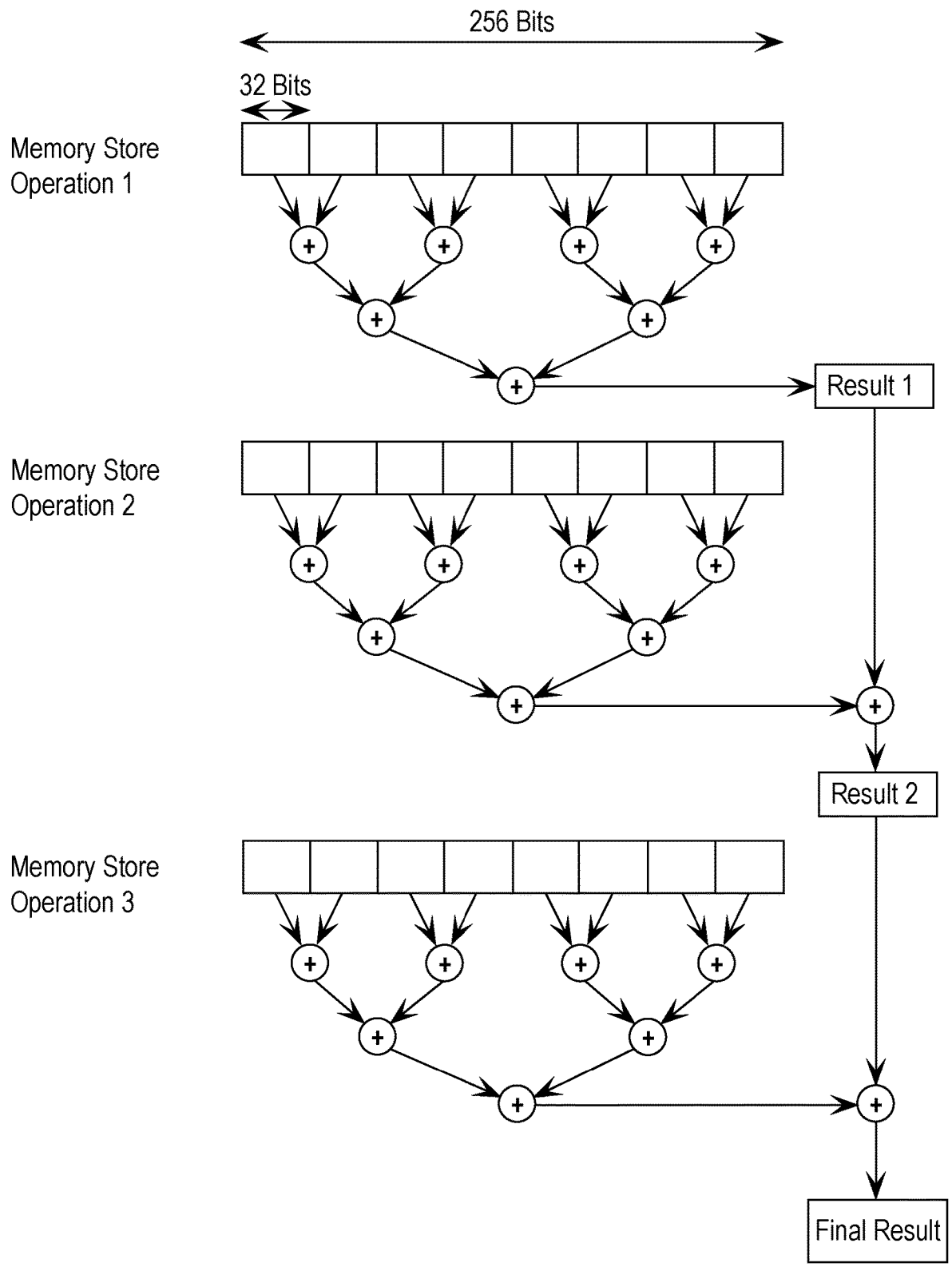
FIG. 4 is a block diagram that depicts an example approach for performing data reduction that uses tree-based pair-wise data reduction after each memory store operation.

One approach for performing data reduction concurrently across multiple data elements in hardware uses tree-based pair-wise data reduction, or "cross-lane" data reduction. FIG. 4 is a block diagram that depicts an example approach for performing tree-based pair-wise data reduction after each memory store operation when the logical width of a memory interface exceeds the width of data elements being stored. In this example, the memory interface width is 256 bits and each data element is represented by 32 bits, providing a maximum of eight 32-bit data elements per memory store operation. The interface data element widths depicted in FIG. 4 are example values and embodiments are not limited to these examples. Also, in this example the data reduction is performed using additions, but embodiments are not limited to performing data reduction using additions and include other types of arithmetic and logical operations.

In the example of FIG. 4, a data transfer process includes three memory store operations and a full tree-based pair-wise data reduction is performed after each memory store operation. More specifically, after the first memory store operation, at the first level of the tree four addition operations are performed on the four pairs of 32-bit data elements to generate pair sums. At the next level of the tree, two addition operations are performed on the four pair sums from the initial set of additions to generate two remaining pair sums. At the final level of the tree, the two remaining pair sums are added to generate Result 1, which is the full data reduction, i.e., the sum, of all eight 32-bit data elements in the first memory store operation.

This process is repeated for the eight 32-bit data elements in second memory store operation and the data reduction result is added to Result 1 to generate Result 2. The eight 32-bit data elements from the third (and final) memory store operation are reduced in a similar manner and the result is added to Result 2 to generate the Final Result, which is the sum of all 24 32-bit data elements from the three memory store operations. This approach requires at least three addition cycles for the three store operations, with each addition cycle requiring seven additions and three steps, to complete the data reduction, which is computationally expensive.

According to an embodiment, in contrast to the cross-lane data reduction approach of FIG. 4, an in-lane data reduction approach performs additions within each 32-bit wide portion of the memory interface across all memory store operations in a data transfer. After the final memory store operation in the data transfer, a full tree-based pair-wise data reduction is performed.

Figure 5:
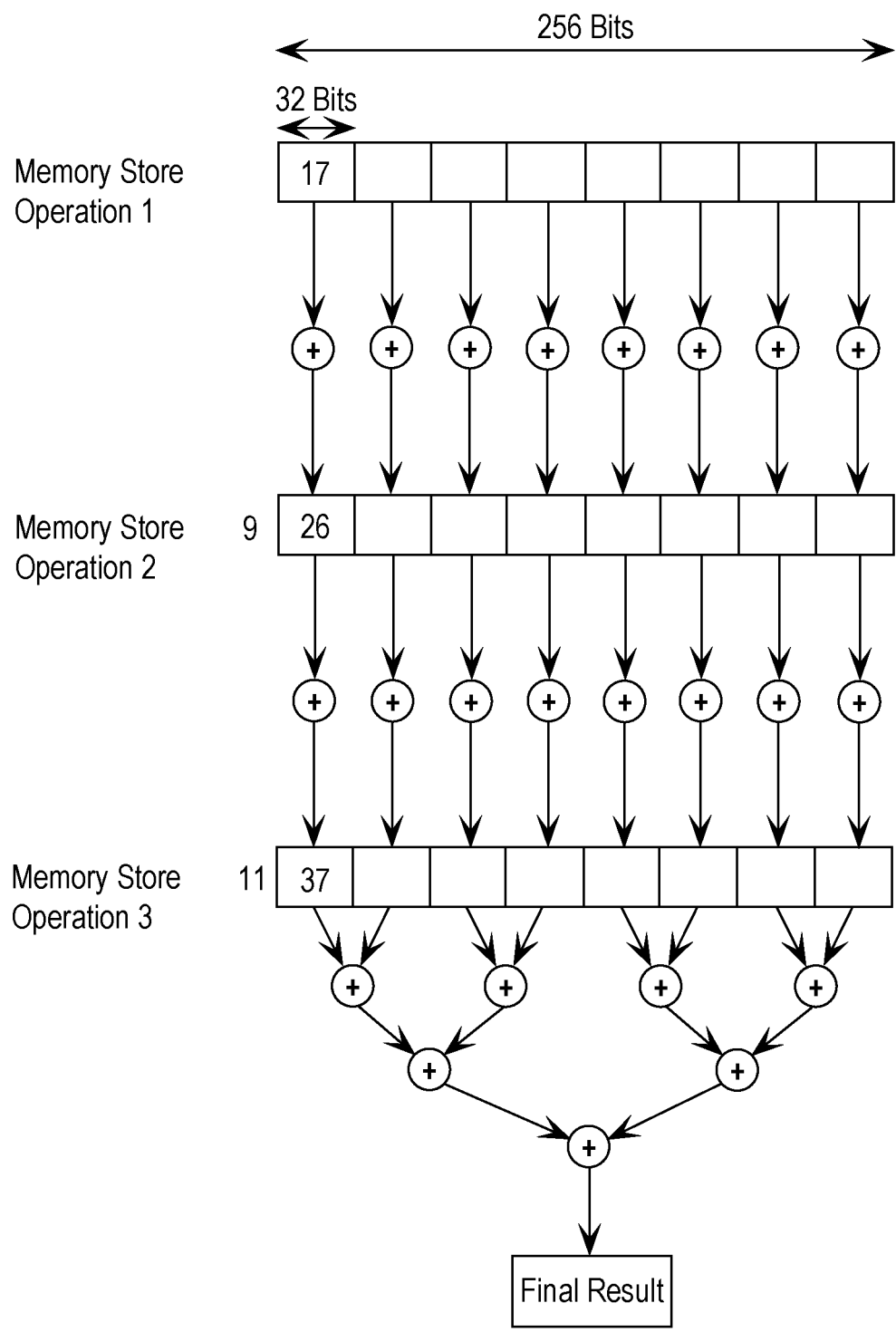
FIG. 5 is a block diagram that depicts an approach for performing "in-lane" data reduction.

FIG. 5 is a block diagram that depicts an approach for performing "in-lane" data reduction. The data is stored into memory using three memory store operations that include two non-final memory store operations and one final memory store operation. According to an embodiment, each lane of data is separately reduced over all of the memory store operations. In the example depicted in FIG. 5, during each memory store operation, data reduction is performed on each 32-bit data element, or lane, providing eight 32-bit data reduction values. For data reduction using addition operations, each 32-bit data element is added to an accumulated value for that corresponding 32-bit data element, or lane, providing eight 32-bit accumulated data values. After the final memory store operation, a full tree-based pair-wise data reduction is performed across the eight 32-bit data reduction values to generate a final data reduction result. For data reduction using addition operations, the final data reduction result is the sum of all of the 32-bit data elements from all three memory store operations.

As depicted in FIG. 5, suppose that the first memory store operation specifies a value of 17 for the first 32-bit data element. The value of 17 is added to the accumulated value for the first 32-bit data element, i.e., the first lane. In this example, it is presumed that the initial accumulated value for the first 32-bit data value is zero, so the accumulated value for the first lane is 17 after the first memory store operation. This is repeated for each of the other 32-bit data values, i.e., lanes. Accumulated data values are maintained in registers, cache, main memory, or in NMR units 100 previously described herein.

The second memory store operation specifies a value of 9 for the first 32-bit data element, i.e., the first lane. The value of 9 is added to the accumulated value of 17 for the first lane to generate a new accumulated value of 26 for the first 32-bit data element. This is repeated for each of the other 32-bit data values, i.e., lanes.

The third (and final) memory store operation specifies a value of 11 for the first 32-bit data element. The value of 11 is added to the accumulated value of 26 to generate a new accumulated value of 37 for the first 32-bit data element. This is repeated for each of the other 32-bit data values, i.e., lanes. After the third memory store operation, each of the other eight 32-bit lanes also has an accumulated value that is the sum of the corresponding 32-bit data elements from each of the three memory store operations. A full tree-based pair-wise data reduction is then performed on the eight accumulated 32-bit data values to generate the Final Result depicted in FIG. 5.

This approach is computationally less expensive than the approach depicted in FIG. 4 because instead of performing a full tree-based pair-wise data reduction after each memory store operation, a single set of parallel additions is performed after each memory store operation. In the example depicted in FIG. 5, a set of eight parallel additions is performed after each memory store operation. While the total number of additions is the same as the approach depicted in FIG. 4, fewer steps are required. In the example of FIG. 4, a total of 23 additions and eleven steps are required, three for each of the full tree-based pair-wise data reductions, and two to generate Result 2 and the Final Result. In contrast, while the in-lane data reduction approach of FIG. 5 also uses 23 additions, only five steps are required.

Although embodiments are depicted in the figures and described herein in the context of equal width lanes, i.e., all of the lanes being 32 bits wide, embodiments are not limited to these examples. According to an embodiment, the lanes have different widths and a memory controller, or other element that is performing the in-lane data reduction, is able to determine the separate data elements within a memory store operation, and that the location of the data elements is consistent across all of the memory store operations. The use of in-lane data reduction is selectable, for example, via a parameter of a memory store operation and/or memory controllers are configured to perform in-lane data reduction.

FIG. 6 is a flow diagram 600 that depicts an approach for performing "in-lane" data reduction. In step 602, initialization is performed and includes several different tasks that vary depending upon a particular implementation. According to an embodiment, memory locations, e.g., registers, NRM units 100, other memory locations, that will store the accumulated data values, are initialized to a specified value, such as zero. Other implementations use values besides zero, depending upon a particular implementation.

After initialization has been completed, then in step 604, a memory store operation is received that includes a plurality of data elements that have a smaller bit width than the width of the memory interface. In step 606, the accumulated values for the data elements are updated. For example, a memory controller causes the values of the data elements specified in the memory store operation to be added to the accumulated value for each corresponding lane.

In step 608, a determination is made whether the memory store operation is the final memory store operation. If not, then control returns to step 604. If the current memory store operation is the final memory store operation, then in step 610 a full tree-based pair-wise data reduction is performed to generate a final data reduction result, as previously described, and the process is complete in step 612.

The invention claimed is:
1. A near-memory reduction unit comprising:
a reduction address register configured to store a reduction address range,
a result register configured to store a data reduction result, and
data reduction logic configured to:
determine whether a destination address of a store operation to store data in an off-die memory is within the reduction address range stored in the reduction address register,
in response to determining that the destination address of the store operation to store data in an off-die memory is within the reduction address range stored in the reduction address register:
process a data value for the store operation by a reduction operation to generate an updated data reduction result, and
store the updated data reduction result in the result register.

2. The near-memory reduction unit of claim 1, wherein the data reduction logic is further configured to initialize the reduction address range to a value specified by an operation to program the reduction address range in the near-memory reduction unit.

3. The near-memory reduction unit of claim 1, wherein the reduction address range is a range of contiguous memory addresses.

4. The near-memory reduction unit of claim 1, wherein the reduction address range is a strided range of memory addresses.

5. The near-memory reduction unit of claim 1, wherein the data reduction result stored in the result register is initialized to a specified value in response to a change to the reduction address range stored in the reduction address register or an initialization operation.

6. The near-memory reduction unit of claim 1, further comprising a counter register configured to store a current count of updates to the result register, wherein the data reduction logic is further configured to, in response to determining that the destination address of the store operation to store data in the off-die memory is within the reduction address range stored in the reduction address register, increment the current count of updates stored in the result register.

7. The near-memory reduction unit of claim 1, wherein the data reduction logic is further configured to:
process the data value for the store operation to store data in off-die memory to create a processed data value, and
cause the processed data value to be processed by the reduction operation to generate the updated reduction result.

8. The near-memory reduction unit of claim 7, wherein the processing of the data value includes one or more of processing the data value by a function or applying a constant to the data value.

9. The near-memory reduction unit of claim 1, wherein the off-die memory is main memory.

10. The near-memory reduction unit of claim 1, wherein:
the data specified by the store operation to store data in off-die memory is stored in a cache, and
the store operation is performed to store the data specified by the store operation from the cache to main memory.

11. The near-memory reduction unit of claim 1, wherein the store operation is a first store operation and the data reduction logic is further configured to, in response to receiving a second store operation with a destination address that is the same as the destination address of the first store operation, set an error bit.

12. The near-memory reduction unit of claim 1, wherein the near-memory reduction unit is implemented in one or more of: a memory controller, a stand-alone entity that is assigned to a memory module, or in a die of a stacked memory package.

13. The near-memory reduction unit of claim 1, wherein the reduction operation is an addition operation that adds the data value for the store operation to an accumulated data reduction result stored in the result register.

14. A method for performing data reduction comprising:
for a plurality of memory store operations that includes one or more non-final memory store operations and a final memory store operation, wherein each memory store operation, from the plurality of memory store operations, includes a plurality of data element values that are each represented by a number of bits that is less than a bit width of a memory interface receiving the plurality of memory store operations:
for each memory store operation, from the plurality of memory store operations, separately performing data reduction on each data element value to generate a corresponding data reduction value, and
after the final memory store operation, performing a tree-based pair-wise data reduction on the corresponding data reduction values to generate a final data reduction result for the plurality of memory store operations.

15. The method for performing data reduction of claim 14, wherein the final data reduction result is a sum of all of the corresponding data reduction values specified in the plurality of memory store operations.

16. The method for performing data reduction of claim 14, wherein the data elements in the plurality of data elements are represented by the same number of bits.

17. The method for performing data reduction of claim 14, wherein the tree-based pair-wise data reduction includes performing data reduction on pairs of data reduction values to generate a plurality of pair data reduction values.

18. The method for performing data reduction of claim 17, wherein the tree-based pair-wise data reduction further includes performing data reduction on pairs of pair data reduction values from the plurality of pair data reduction values to generate the final data reduction result.

19. The method for performing data reduction of claim 17, wherein the data reduction values are stored in near-memory reduction units.

20. The method for performing data reduction of claim 17, wherein the method is performed by a memory controller.

* * * * *